United States Patent
Kawabe

(10) Patent No.: US 12,191,549 B2
(45) Date of Patent: Jan. 7, 2025

(54) CIRCUIT BOARD, CIRCUIT BOARD CONNECTION STRUCTURE, AND METHOD OF MANUFACTURING CIRCUIT BOARD CONNECTION STRUCTURE

(71) Applicant: Murata Manufacturing Co., Ltd., Nagaokakyo (JP)

(72) Inventor: Kentarou Kawabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 268 days.

(21) Appl. No.: 17/974,581

(22) Filed: Oct. 27, 2022

(65) Prior Publication Data

US 2023/0043114 A1 Feb. 9, 2023

Related U.S. Application Data

(63) Continuation of application No. PCT/JP2021/017818, filed on May 11, 2021.

(30) Foreign Application Priority Data

May 14, 2020 (JP) ................................. 2020-084867

(51) Int. Cl.
*H03H 7/38* (2006.01)
*H01P 1/04* (2006.01)
(Continued)

(52) U.S. Cl.
CPC ................. *H01P 1/04* (2013.01); *H01P 3/08* (2013.01); *H01P 3/085* (2013.01); *H03H 7/38* (2013.01);
(Continued)

(58) Field of Classification Search
CPC ... H03H 7/38; H01P 3/08; H01P 3/085; H01P 3/087; H01P 3/088; H01P 1/04; H05K 1/0212; H05K 1/14; H05K 3/4632
See application file for complete search history.

(56) References Cited

U.S. PATENT DOCUMENTS

| | | | |
|---|---|---|---|
| 2014/0118984 A1 | 5/2014 | Fujihara et al. | |
| 2020/0194859 A1 | 6/2020 | Araki | |
| 2020/0267831 A1 | 8/2020 | Koyama | |

FOREIGN PATENT DOCUMENTS

| | | |
|---|---|---|
| JP | 2014086616 A | 5/2014 |
| WO | 2019098011 A1 | 5/2019 |
| WO | 2019131288 A1 | 7/2019 |

OTHER PUBLICATIONS

International Search Report in PCT/JP2021/017818, mailed Jul. 27, 2021, 3 pages.
(Continued)

*Primary Examiner* — Stephen E. Jones
(74) *Attorney, Agent, or Firm* — Keating & Bennett, LLP

(57) ABSTRACT

A circuit board includes a multilayer body including a main surface, a mounted conductor, and a signal conductor at an intermediate position in the lamination direction of the multilayer body, and a ground conductor on the main surface. The multilayer body includes a connection portion including a portion overlapping the mounted conductor and overlapping an external board joined via a conductive joint material through use of the mounted conductor, and a circuit portion. A first region, which is the region of a circuit portion of the ground conductor, includes opening holes and a second region, which is the region of a connection portion of the ground conductor, includes opening holes. The ratio of the opening area of the opening holes to that of the second region is larger than the ratio of the opening area of the opening holes to that of the first region.

19 Claims, 4 Drawing Sheets

(51) Int. Cl.
*H01P 3/08* (2006.01)
*H05K 1/02* (2006.01)
*H05K 1/14* (2006.01)
*H05K 3/46* (2006.01)

(52) U.S. Cl.
CPC ........... *H05K 1/021* (2013.01); *H05K 1/0212* (2013.01); *H05K 1/14* (2013.01); *H05K 3/4632* (2013.01)

(56) References Cited

OTHER PUBLICATIONS

Written Opinion in PCT/JP2021/017818, mailed Jul. 27, 2021, 3 pages.

CIRCUIT BOARD, CIRCUIT BOARD CONNECTION STRUCTURE, AND METHOD OF MANUFACTURING CIRCUIT BOARD CONNECTION STRUCTURE

CROSS REFERENCE TO RELATED APPLICATIONS

This application claims the benefit of priority to Japanese Patent Application No. 2020-084867, filed on May 14, 2020, and is a Continuation Application of PCT Application No. PCT/JP2021/017818, filed on May 11, 2021. The entire contents of each application are hereby incorporated herein by reference.

BACKGROUND OF THE INVENTION

1. Field of the Invention

The present invention relates to the structure of a connection portion of a circuit board including a multilayer body including thermoplastic resin layers that are laminated.

2. Description of the Related Art

International Publication No. 2019/131288 describes a transmission line device to which a plurality of transmission lines are connected. The transmission line device described in International Publication No. 2019/131288 includes a first transmission line and a second transmission line. The first transmission line and the second transmission line have insulation base materials made of thermoplastic resin.

Each of the first transmission line and the second transmission line has a connection portion. The first transmission line and the second transmission line are connected (joined) to each other via conductive joint materials in the connection portions thereof.

In the structure described in International Publication No. 2019/131288, first, insulating layers made of thermoplastic resin are laminated and thermally pressure-bonded to each other to form the first transmission line and the second transmission line.

Next, the connection portions of the first transmission line and the second transmission line are connected to each other by performing processing such as locally heating the connection portions.

However, in the structure described in International Publication No. 2019/131288, the connection portions receive a larger thermal history than other portions. This causes the connection portions to readily undergo unintended deformation and peeling of the ground conductor or the like.

SUMMARY OF THE INVENTION

Preferred embodiments of the present invention reduce or prevent the connection portions from undergoing unintended deformation and peeling of conductors or the like.

A circuit board according to a preferred embodiment of the present invention includes a multilayer body including laminated thermoplastic resin layers, the multilayer body including a first main surface on one end in a lamination direction and a second main surface on another end in the lamination direction, a mounted conductor on the first main surface, and a planar conductor located closer to the second main surface than the multilayer body and other conductors provided in the mounted conductor. The multilayer body includes a connection portion joined to an external board via a conductive joint material through use of the mounted conductor, and a circuit portion other than the connection portion. A first region includes a first opening hole and a second region includes a second opening hole, the first region being a region of the circuit portion of the planar conductor, the second region being a region of the connection portion of the planar conductor. A ratio of an opening area of the second opening hole to an area of the second region is larger than a ratio of an opening area of the first opening hole to an area of the first region.

This structure properly controls the deformation of thermoplastic resin in the portion in which the circuit board is connected to an external board, more specifically, in the portion in which the circuit board is connected (joined) to an external board through application of thermal history, thereby making unintended deformation of the multilayer body and peeling of interfaces between insulator layers and conductors or the like less likely to occur.

According to preferred embodiments of the present invention, unintended deformation of the multilayer body and peeling of conductors or the like is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
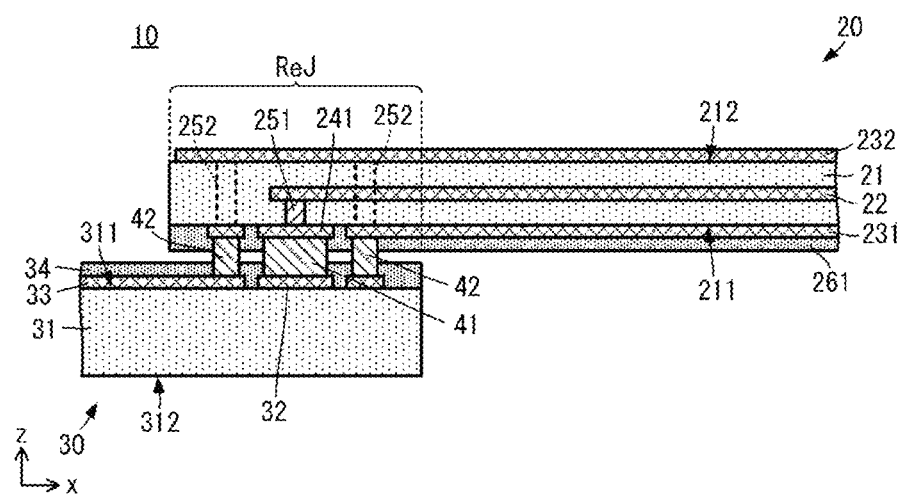
FIG. 1A is a side sectional view schematically illustrating a circuit board connection structure 10 according to a first preferred embodiment of the present invention.
Figure 1B:
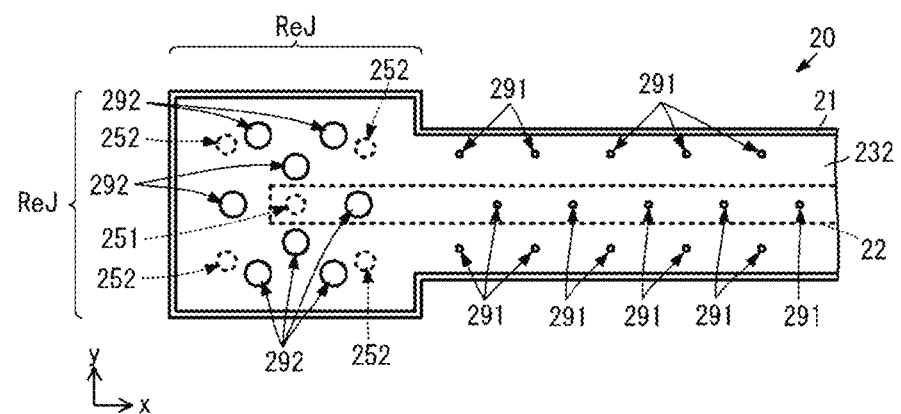
FIG. 1B is a plan view of a circuit board 20 according to the first preferred embodiment of the present invention.
Figure 2A:
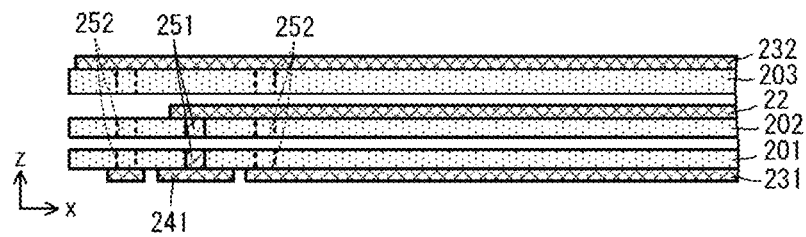
FIGS. 2A to 2D are diagrams describing a non-limiting example of a method of manufacturing the circuit board connection structure 10.
Figure 2B:
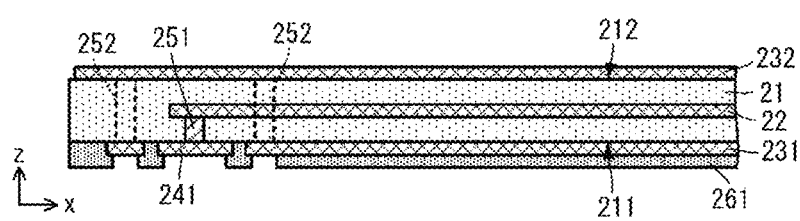

A board joint structure according to a first preferred embodiment of the present invention will be described with reference to the drawings. FIG. 1A is a side sectional view schematically illustrating a circuit board connection structure 10 according to the first preferred embodiment. FIG. 1B is a plan view of a circuit board 20 according to the first preferred embodiment. It should be noted that FIGS. 1A and 1B illustrate portions of the circuit board and the board, and FIG. 1A illustrates an appropriate cross section that makes the structure easy to understand. In addition, FIGS. 1A and 1B exaggerate dimensions as appropriate. FIGS. 2A to 2D are used to describe a non-limiting example of a method of manufacturing the circuit board connection structure. FIG. 3 is a side sectional view of an enlarged portion of an opening hole 292 of a connection portion ReJ.

As illustrated in FIGS. 1A and 1B, the circuit board connection structure 10 preferably includes the circuit board 20 and a board 30. The board 30 corresponds to the external board of the present invention.

Structure of the Circuit Board 20

The circuit board 20 includes a multilayer body 21, a signal conductor 22, a ground conductor 231, a ground conductor 232, a mounted conductor 241, an interlayer connection conductor 251, interlayer connection conductors 252, and a protective film 261.

The multilayer body 21 includes insulator layers 201, 202, and 203. The insulator layers 201, 202, and 203 are preferably made of thermoplastic resin, for example. The multilayer body 21 is formed by laminating the insulator layers 201, 202, and 203 and thermally pressure-bonding the insulator layers 201, 202, and 203. As a result, the multilayer body 21 includes a main surface 211 at one end in the lamination direction and a main surface 212 at another end in the lamination direction. The main surface 211 corresponds to the first main surface, and the main surface 212 corresponds to the second main surface.

The multilayer body 21 includes the connection portion ReJ and the circuit portion. The connection portion ReJ is the portion that overlaps the board 30 in the lamination direction (in the Z-axis direction of the drawing, which is referred to as plan view), and the circuit portion is the portion other than the connection portion ReJ. In the present preferred embodiment, the width (the width in the direction (the Y-axis direction in the drawing) orthogonal or substantially orthogonal to the extension direction of the signal conductor 22 and the lamination direction of the insulator layer) of the connection portion ReJ is larger than the width of the circuit portion.

The signal conductor 22 has a shape that extends in the transmission direction (for example, the X-axis direction in the example of the drawing) of the signal. The signal conductor 22 is a linear conductor. The signal conductor 22 is provided across both the connection portion ReJ and the circuit portion. The signal conductor 22 is located at an intermediate position in the lamination direction (Z-axis direction) of the multilayer body 21.

The ground conductor 231 is a planar conductor and disposed on or substantially on the entire surface of the main surface 211 of the multilayer body 21. The entire or substantially the entire surface includes the entire main surface 211. That is, the ground conductor 231 is provided at both the connection portion ReJ and the circuit portion. The ground conductor 231 overlaps the signal conductor 22 in the lamination direction and is a conductor wider than the signal conductor 22. However, the ground conductor 231 preferably has a shape that extends across the entire width of the multilayer body 21.

The region of the connection portion ReJ of the ground conductor 231 includes an opening (in which no conductor is provided) to include one end of the signal conductor 22.

The mounted conductor 241 is, for example, a rectangular or substantially rectangular conductor in plan view. The mounted conductor 241 is on the main surface 211. The mounted conductor 241 is in the opening of the ground conductor 231 described above and overlaps one end of the signal conductor 22. That is, the mounted conductor 241 is in the region of the connection portion ReJ.

The mounted conductor 241 is separated from the ground conductor 231.

The ground conductor 232 is a planar conductor and is disposed on or substantially on an entire surface of the main surface 212 of the multilayer body 21. The entire or substantially the entire surface includes the entire main surface 212. That is, the ground conductor 232 is provided at both the connection portion ReJ and the circuit portion. The ground conductor 232 overlaps the signal conductor 22 in the lamination direction and is a conductor wider than the signal conductor 22. However, the ground conductor 232 preferably has a shape that extends across the entire or substantially the entire width of the multilayer body 21.

The ground conductor 232 may be separated into the connection portion ReJ part and the circuit portion. However, when the ground conductor 232 is continuous between the connection portion ReJ portion and the circuit portion, even if opening holes 291 and opening holes 292, which will be described later, are present, the ground characteristics can be stabilized.

In addition, since the ground conductor 232 and the ground conductor 231 are planar conductors and wider than the signal conductor 22, even if the opening holes 291 and the opening holes 292, which will be described later, are present, changes in the characteristic impedance can be reduced or prevented to improve the electromagnetic shielding against the external environment. In particular, when the ground conductor 232 and the ground conductor 231 overlap the signal conductor 22 to sandwich the signal conductor 22 therebetween in plan view as in the present invention, the electromagnetic shielding against the external environment can be improved. Furthermore, when the ground conductor 232 overlaps the signal conductor 22 and extends across an entire or substantially an entire width of the multilayer body 21 as in the present invention, even if the opening holes 291 and the opening holes 292 are present, changes in the characteristic impedance can be further reduced or prevented to further improve the electromagnetic shielding against the external environment.

The signal conductor 22, the ground conductor 231, the ground conductor 232, and the mounted conductor 241 are preferably made of, for example, copper foil or the like.

The interlayer connection conductor 251 and the interlayer connection conductors 252 are provided in the connection portion ReJ of the multilayer body 21.

The interlayer connection conductor 251 is located at a position overlapping the signal conductor 22 and the mounted conductor 241 in plan view. The interlayer connection conductor 251 connects the signal conductor 22 and the mounted conductor 241 to each other.

The interlayer connection conductors 252 are preferably located at positions that do not overlap the signal conductor 22, but overlap the ground conductor 231 and the ground conductor 232 in plan view. The interlayer connection conductors 252 connect the ground conductor 231 and the ground conductor 232 to each other. It should be noted that the plurality of interlayer connection conductors 252 are provided.

The interlayer connection conductor 251 and the interlayer connection conductors 252 are formed by allowing, for example, a conductive paste to solidify.

Although not illustrated, interlayer connection conductors the same as or similar to the interlayer connection conductors 252 are also provided in a predetermined pattern in the circuit portion.

The protective film 261 is in a portion of the multilayer body 21 close to the main surface 211. The protective film 261 is a resist film or the like and is electrically insulated. The protective film 261 includes an opening through which a portion of the region of the connection portion ReJ of the ground conductor 231 is exposed to the outside. In addition, the protective film 261 includes an opening through which the mounted conductor 241 is partially exposed to the outside. These openings are used for connection to the board 30.

This causes the circuit board 20 to achieve a transmission line of triplate stripline type that includes, as external connection terminals, the exposed portion of the mounted conductor 241 and the exposed portion of the ground conductor 231 in the connection portion ReJ.

Structure of the Board 30

The board 30 includes an insulating base material 31, a signal land conductor 32, a ground land conductor 33, and a protective film 34. The base material 31 includes a main surface 311 and a main surface 312. The base material 31 is defined by a resin board of, for example, FR4 or the like.

The signal land conductor 32 and the ground land conductor 33 are on the main surface 311. The signal land conductor 32 and the ground land conductor 33 are preferably made of, for example, copper foil or the like.

The protective film 34 is in a portion of the base material 31 close to the main surface 311. The protective film 34 is a resist film or the like and is electrically insulated. The protective film 34 includes openings through which portions of the signal land conductor 32 and the ground land conductor 33 are exposed to the outside. These openings are used to connect to the circuit board 20.

Connection Structure between the Circuit Board 20 and the Board 30

The connection portion ReJ of the circuit board 20 overlaps the board 30 in plan view. More specifically, the exposed portion of the mounted conductor 241 overlaps the exposed portion of the signal land conductor 32. The exposed portion of the ground conductor 231 in the connection portion ReJ overlaps the exposed portion of the ground land conductor 33. In addition, the mounted conductor 241 and the signal land conductor 32 are connected to each other via a conductive joint material 41. The ground conductor 231 and the ground land conductor 33 are connected to each other via conductive joint materials 42. An example of the conductive joint material 41 and the conductive joint materials 42 is solder.

The connection via the conductive joint material 41 and the conductive joint materials 42 is achieved by applying heat and pressure to the overlapping portion between the connection portion ReJ of the circuit board 20 and the board 30.

Method of Manufacturing the Connection Structure Between the Circuit Board 20 and the Board 30

The structure described above is produced by the manufacturing method below, for example. First, as illustrated in FIG. 2A, an insulator layer 201 on which the ground conductor 231 has been formed, an insulator layer 202 on which the signal conductor 22 has been formed, and an insulator layer 203 on which the ground conductor 232 has been formed are laminated together. The insulator layer 201 and the insulator layer 202 have a through-hole for the interlayer connection conductor 251, and the through-hole is filled with the conductive paste. In addition, the insulator layer 201, the insulator layer 202, and the insulator layer 203 have through-holes for the interlayer connection conductors 252, and the through-holes are filled with the conductive paste.

Next, the structure in which the insulator layer 201, the insulator layer 202, and the insulator layer 203 are laminated together is thermally pressure-bonded to form the multilayer body 21. At this time, the conductive paste solidifies to form the interlayer connection conductor 251 and the interlayer connection conductors 252. Then, the protective film 261 is defined in a portion of the multilayer body 21 close to the main surface 211 to form the circuit board 20 as illustrated in FIG. 2B.

Next, the conductive joint material such as, for example, solder is on the exposed portion of the signal land conductor 32 of the board 30 and the exposed portion of the ground land conductor 33.

Figure 2C:
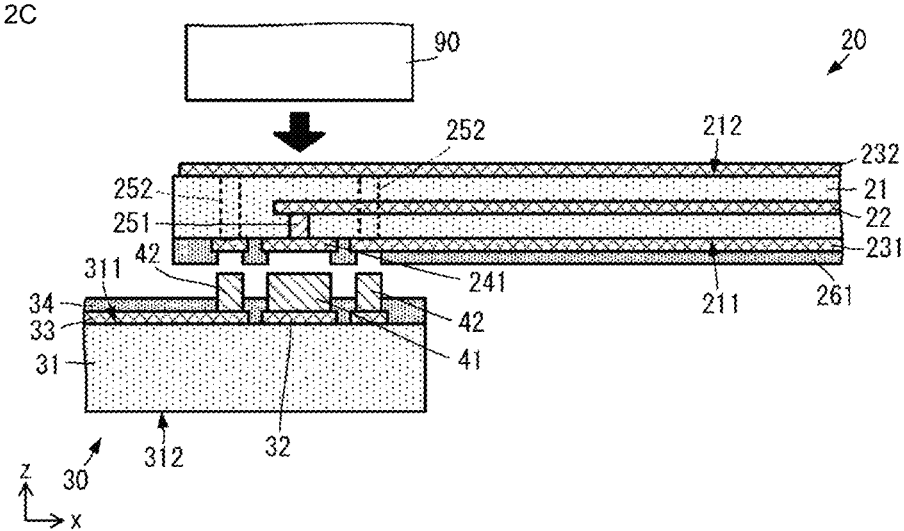
Figure 2D:
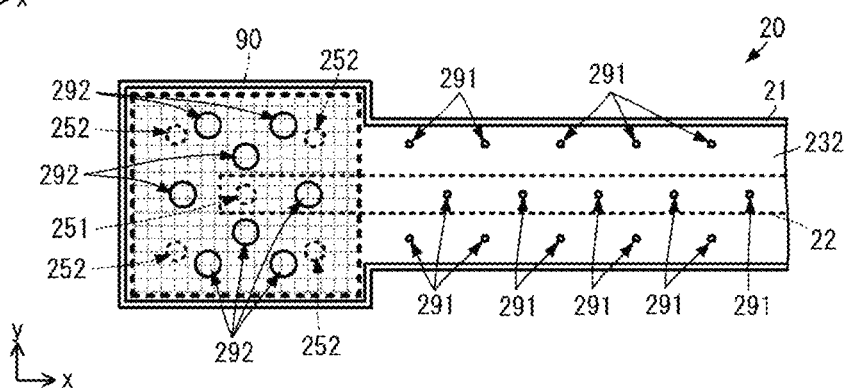
Figure 3:
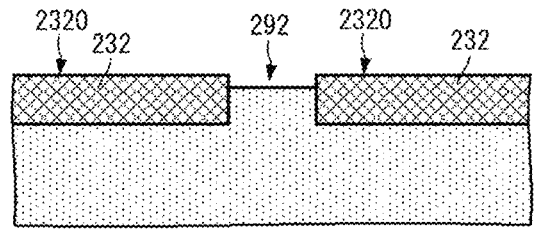
FIG. 3 is a side sectional view of an enlarged portion of an opening hole 292 of a connection portion ReJ according to a preferred embodiment of the present invention.

Next, as illustrated in FIG. 2C, the connection portion ReJ of the circuit board 20 is superposed on the board 30. At this time, the circuit board 20 is disposed such that the main surface 211 opposes the board 30. Then, the connection portion ReJ of the circuit board 20 is thermally pressure-bonded to the board 30 by the heater bar 90 through the main surface 212 of the circuit board 20 (multilayer body 21). At this time, as illustrated in FIGS. 2C and 2D, the heater bar 90 is pushed against the main surface 212 of the circuit board 20 while making contact with substantially an entire surface of the connection portion ReJ to include at least the position overlapping the conductive joint material in plan view.

This allows the conductive joint material to solidify to connect the circuit board 20 and the board 30 to each other.

More Specific Structure of the Ground Conductor

The ground conductor 232 includes the opening holes 291 and the opening holes 292. The opening hole 291 corresponds to the first opening hole, and the opening hole 292 corresponds to the second opening hole. The opening holes 291 and the opening holes 292 are defined by the portions of the ground conductor 232 in which no conductor is provided.

The opening holes 291 are in the region of the circuit portion of the ground conductor 232. The opening holes 292 are in the region of the connection portion ReJ of the ground conductor 232. The region of the circuit portion of the ground conductor 232 corresponds to the first region, and the region of the connection portion ReJ of the ground conductor 232 corresponds to the second region.

The opening area of the opening hole 292 is larger than the opening area of the opening hole 291. The opening area (opening area of the connection portion) of the opening holes 292 defined in the ground conductor 232 in the region of the connection portion ReJ is larger than the opening area (opening area of the circuit portion) of the opening holes 291 defined in the ground conductor 232 in the region of the circuit portion. More specifically, the ratio of the sum of the opening areas of the opening holes 292 to the area of the second region of the ground conductor 232 is larger than the ratio of the sum of the opening areas of the opening holes 291 to the area of the first region of the ground conductor 232. The opening area of the connection portion may be the same or approximately the same as the opening area of the circuit portion but is preferably larger than the opening area of the circuit portion.

When the opening holes 291 and the opening holes 292 described above are present, the gas generated from the insulating layers of the multilayer body 21 can be released to the outside of the multilayer body 21 when the multilayer body 21 of the circuit board 20 is formed, that is, when the multilayer body 21 is thermally pressure-bonded. As a result, unintended deformation of the multilayer body 21 can be reduced or prevented. In addition, it is possible to reduce or prevent peeling at interfaces between the signal conductor 22, the ground conductors 231 and 232, and the multilayer body 21, that is, at interfaces in the circuit board 20.

Furthermore, as described above, when the circuit board 20 is connected to the board 30, heat and pressure are applied to mainly the connection portion ReJ, and heat and pressure are only slightly applied to the circuit portion. Accordingly, the heat and pressure applied to the connection portion ReJ is greater than the heat and pressure applied to the circuit portion. However, since the opening area of the connection portion is larger than the opening area of the circuit portion, even when the connection portion ReJ receives greater (more) heat and pressure than the circuit portion, the connection portion ReJ can perform appropriate venting depending on the opening area. As a result, unintended deformation of the multilayer body 21 can be reduced or prevented in the connection portion ReJ, and peeling at interfaces in the circuit board 20 can be reduced or prevented.

In addition, in the structure described above, the opening area of the opening holes 291 in the circuit portion is smaller than the opening area of the opening holes 292 provided in the connection portion ReJ. More specifically, the opening area of each of the opening holes 291 is smaller than the opening area of each of the opening holes 292. This can reduce or prevent changes in the characteristic impedance in the circuit portion of the multilayer body 21 and improve the electromagnetic shielding in addition to the operation and effect described above. In addition, the periodic disposition of the opening holes 291 can reduce or prevent local changes in the characteristic impedance and a reduction in the electromagnetic shielding.

In addition, the proportion of the circuit portion in the circuit board is often larger than that of the connection portion ReJ. Accordingly, the advantageous operations and effects described above can also be obtained in the circuit board 20, and the electromagnetic shielding can be improved by reduce or preventing changes in the characteristic impedance. That is, this structure can reduce or prevent unintended deformation and peeling of interfaces of the connection portion ReJ, which readily undergoes unintended deformation and peeling of interfaces compared with the circuit portion, while reducing or preventing changes in the characteristic impedance and improving the electromagnetic shielding.

In addition, the structure described above includes the dispersed opening holes 292. Therefore, this structure can further reduce or prevent the local discontinuity of the characteristic impedance and the degradation of the electromagnetic shielding compared with the structure having one or a few larger opening holes. In addition, since partial concentration of regions not in contact with the heater bar 90 can be reduced or prevented, heat and pressure can be applied uniformly to the entire connection portion ReJ.

In addition, the interlayer connection conductor 251 and the interlayer connection conductors 252 are present in the connection portion ReJ. The interlayer connection conductor 251 and the interlayer connection conductors 252 are formed by allowing the conductive paste to solidify through heating as described above. At this time, the conductive paste generates a large amount of gas. For example, a gas is generated when resin included in the conductive paste solidifies and, for example, a Cu—Sn alloy defining the conductive paste reacts. However, since the opening area of the connection portion is large, the gas generated from the conductive paste can be effectively released to the outside through the opening holes 292 of the connection portion ReJ. That is, even when the interlayer connection conductor 251 and the interlayer connection conductors 252 are present, the connection portion ReJ can achieve appropriate venting. Accordingly, unintended deformation of the multilayer body 21 in the connection portion ReJ can be reduced or prevented, and peeling at interfaces in the circuit board 20 can be reduced or prevented.

In addition, in the structure of the present preferred embodiment, the positions of the interlayer connection conductor 251 and the interlayer connection conductors 252 are different from the positions of the opening holes 292 in plan view. That is, the ground conductor 232 is located at the positions of the interlayer connection conductor 251 and the interlayer connection conductors 252. Accordingly, the heat from the heater bar 90, which can be used to allow the interlayer connection conductor 251 and the interlayer connection conductors 252 to solidify, can be transferred effectively. This can allow the interlayer connection conductor 251 and the interlayer connection conductors 252 to solidify with greater certainty. This improves the reliability of the interlayer connection conductor 251 and the interlayer connection conductors 252, ultimately improving the reliability of the circuit board 20.

Furthermore, in this structure, the interlayer connection conductor 251 overlaps the conductive joint material 41 in plan view, and the interlayer connection conductors 252 overlap the conductive joint materials 42 in plan view. In addition, they overlap the ground conductor 232 but do not overlap the opening holes 292. Accordingly, the heat from the heater bar 90 can be effectively transferred to the conductive joint material 41 and the conductive joint materials 42 effectively. This can allow the conductive joint material 41 and the conductive joint materials 42 to solidify with greater certainty. This improves the reliability of the conductive joint material 41 and the conductive joint materials 42, that is, the connection reliability between the circuit board 20 and the board 30.

In an aspect of the present preferred embodiment, the interlayer connection conductor 251, the interlayer connection conductors 252, the conductive joint material 41, and the conductive joint materials 42 preferably do not completely overlap the opening holes 292. However, the interlayer connection conductor 251, the interlayer connection conductors 252, the conductive joint material 41, and the conductive joint materials 42 may partially overlap the opening holes 292. However, considering the efficiency of heat transfer described above, the interlayer connection conductor 251, the interlayer connection conductors 252, the conductive joint material 41, and the conductive joint materials 42 do not completely overlap the opening holes 292 preferably.

The opening area of the opening hole 292 is preferably determined such that, even when, for example, the multilayer body 21 projects from the opening hole 292 after the circuit board 20 and the board 30 are connected to each other, the multilayer body 21 does not project from an outer surface 2320 of the ground conductor 232, as illustrated in FIG. 3. That is, the opening area of the opening hole 292 may be determined such that the exposed surface of the multilayer body 21 does not project from the outer surface 2320 of the ground conductor 232 after the circuit board 20 and the board 30 are connected to each other. This can reduce or prevent the distance between the ground conductor 232 and the signal conductor 22 from becoming unnecessarily short. Accordingly, unnecessary changes in the characteristic impedance of a high-frequency signal transmitted by the circuit board 20 are reduced or prevented.

Although the planar shapes of the opening hole 292 and the opening hole 291 are circular or substantially circular in the description above, the planar shapes are not limited to circular. That is, as long as the opening holes have opening areas that achieve the functions described above, the opening hole 292 and the opening hole 291 may have other planar shapes.

Modification of the First Preferred Embodiment

Figure 4:
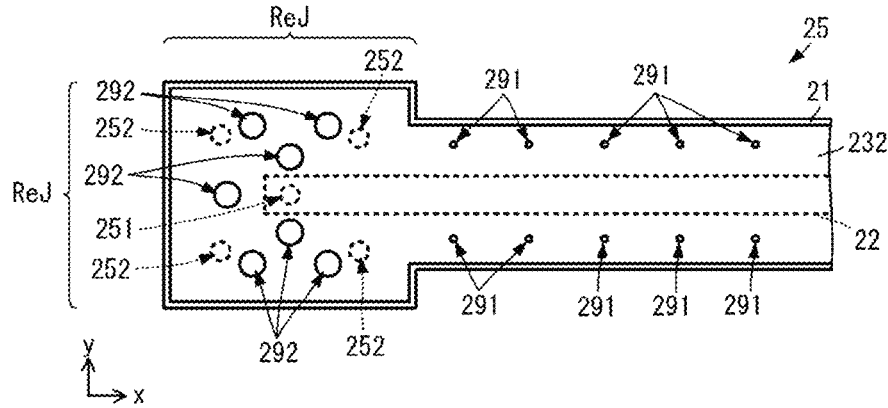
FIG. 4 is a plan view of a circuit board 25 according to a modification of the first preferred embodiment of the present invention.

A board joint structure according to a modification of the first preferred embodiment of the present invention will be described with reference to the drawing. FIG. 4 is a plan view of the connection portion of the circuit board 25 according to a modification of the first preferred embodiment.

As illustrated in FIG. 4, the circuit board 25 according to the modification of the first preferred embodiment is different from the circuit board 20 according to the first preferred embodiment in that the signal conductor 22 does not overlap the opening holes 291 and the opening holes 292 in plan view. The other structure of the circuit board 25 is preferably the same or substantially the same as in the circuit board 20, so the same or substantially the same structure will not be described.

The ground conductor 232 includes the opening holes 291 and the opening holes 292. The opening holes 291 are provided periodically in the region of the circuit portion of the ground conductor 232. The opening holes 291 do not overlap the signal conductor 22 in plan view. In addition, the opening holes 292 are provided periodically in the region of the connection portion ReJ of the ground conductor 232. The opening holes 292 do not overlap the signal conductor 22 in plan view.

Since the opening holes 291 and the opening holes 292 are configured to avoid the signal conductor 22 in this structure, a reduction in the electromagnetic shielding for the signal conductor 22 can be reduced or prevented in addition to obtaining the advantageous operations and effects of the first preferred embodiment.

Second Preferred Embodiment

Figure 5:
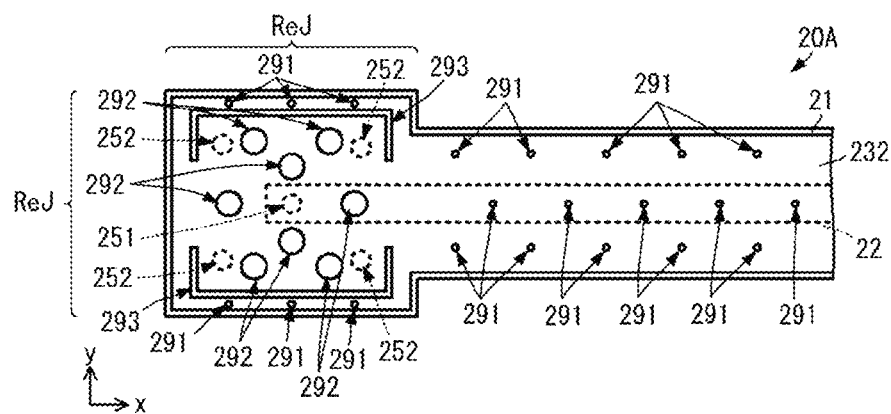
FIG. 5 is a plan view of the connection portion ReJ of a circuit board 20A according to a second preferred embodiment of the present invention.

A board joint structure according to a second preferred embodiment of the present invention will be described with reference to the drawing. FIG. 5 is a plan view of a connection portion of a circuit board 20A according to the second preferred embodiment.

As illustrated in FIG. 5, the circuit board 20A according to the second preferred embodiment is different from the circuit board 20 according to the first preferred embodiment in that slit openings 293 are present. The other structure of the circuit board 20A is the same or substantially the same as in the circuit board 20, so the same structure will not be described.

The slit openings 293 are in the region of the connection portion ReJ of the ground conductor 232. The slit openings 293 are a partial frame and defined by portions of the ground conductor 232 in which no conductor is provided.

The slit openings 293 are in the region in which the opening holes 292 are provided in plan view and the region in which the interlayer connection conductor 251 and the interlayer connection conductors 252 are provided in plan view. In other words, the slit openings 293 are provided to include the entire or substantially the entire region with which the heater bar 90 described above makes contact.

This makes the heat from the heater bar 90 less likely to leak to the outside from the region surrounded by the slit openings 293 of the ground conductor 232. Accordingly, the heat from the heater bar 90 is effectively transferred to the inside of the connection portion ReJ. As a result, the conductive joint material 41, the conductive joint materials 42, the interlayer connection conductor 251, and the interlayer connection conductors 252 as described above can be effectively solidified. In addition, an unnecessary flow of the multilayer body 21 near the side edge portion of the connection portion ReJ is reduced or prevented.

It should be noted that the slit openings 293 may be continuous over the entire circumference but are preferably partially discontinuous. This stabilizes the ground in the connection portion ReJ. In addition, the area of the region inside the slit openings 293 is preferably larger than the area of the contact surface of the heater bar 90. This makes the heater bar 90 easily come into contact with only the region inside the slit openings 293 even if an error occurs in the contact position of the heater bar 90.

Third Preferred Embodiment

Figure 6:
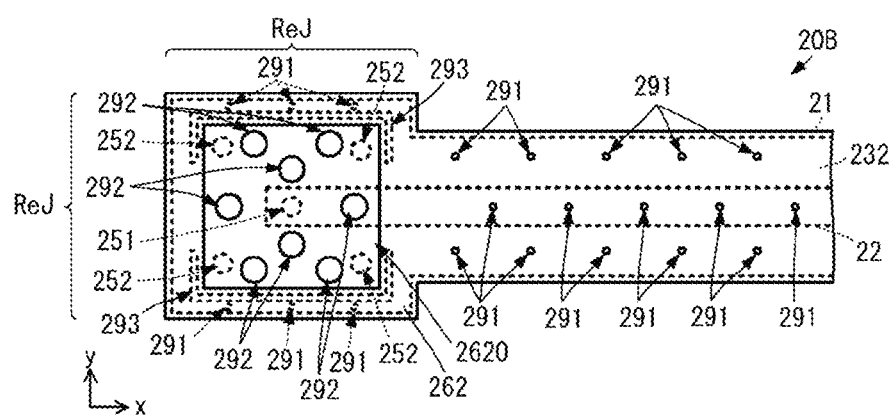
FIG. 6 is a plan view of the connection portion ReJ of a circuit board 20B according to a third preferred embodiment of the present invention.

A board joint structure according to a third preferred embodiment of the present invention will be described with reference to the drawing. FIG. 6 is a plan view of the connection portion ReJ of a circuit board 20B according to the third preferred embodiment.

As illustrated in FIG. 6, the circuit board 20B according to the third preferred embodiment is different from the circuit board 20A according to the second preferred embodiment in that a protective film 262 is present. The other structure of the circuit board 20B is the same or substantially the same as in the circuit board 20A, so the same or substantially the same structure will not be described.

The protective film 262 is a resist film or the like as the protective film 261. The protective film 262 is in a portion of the multilayer body 21 close to the main surface 212.

The protective film 262 is provided at both the connection portion ReJ and the circuit portion. The protective film 262 covers the entire or substantially the entire surface of the ground conductor 232 in the circuit portion.

The protective film 262 includes a protective film opening 2620 in the connection portion ReJ. The protective film 262 covers the entire or substantially the entire surface of the ground conductor 232 with the exception of the protective film opening 2620.

The protective film opening 2620 is in the region inside the slit openings 293 in plan view. Furthermore, the protective film opening 2620 overlaps the interlayer connection conductor 251, the interlayer connection conductors 252, the conductive joint material 41, and the conductive joint materials 42 in plan view.

In such a structure, the circuit board 20B can protect the ground conductor 232 from the external environment in the circuit portion and the connection portion ReJ portion. In addition, when applying heat and pressure with the heater bar 90, the heater bar 90 can make direct contact with the ground conductor 232. The heater bar 90 can make contact with the ground conductor 232 with greater certainty by particularly making the shape of the protective film opening 2620 larger than the shape of the contact surface of the heater bar 90.

Furthermore, the slit openings 293 overlap the protective film 262 in the structure of the preferred embodiment. That is, the protective film 262 is embedded in the slit openings 293. This can reduce or prevent an outflow of the multilayer body 21 from the slit openings 293 when the heater bar 90 applies heat and pressure. Accordingly, it is possible to reduce or prevent the distance between the ground conductor 232 and the signal conductor 22 from becoming shorter and achieve a desired characteristic impedance with greater certainty.

Fourth Preferred Embodiment

Figure 7:
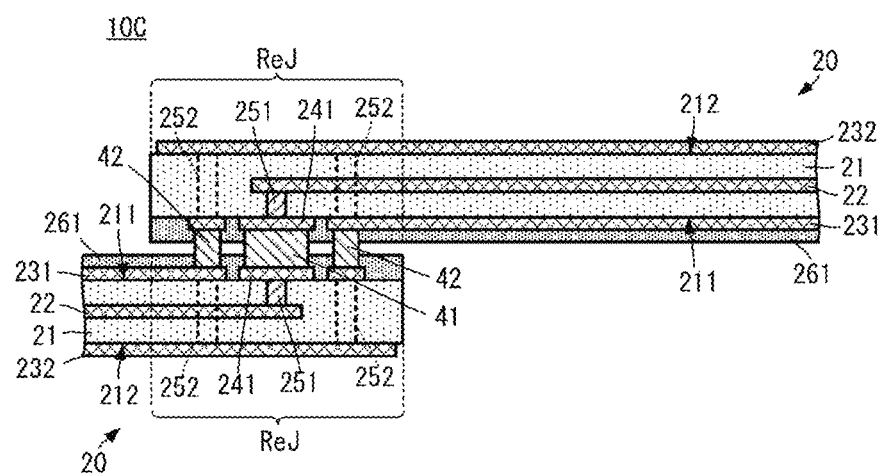
FIG. 7 is a side sectional view schematically illustrating a circuit board connection structure 10C according to a fourth preferred embodiment of the present invention.

A board joint structure according to a fourth preferred embodiment of the present invention will be described with reference to the drawing. FIG. 7 is a side sectional view schematically illustrating a circuit board connection structure 10C according to the fourth preferred embodiment.

As illustrated in FIG. 7, the circuit board connection structure 10C according to the fourth preferred embodiment is different from the circuit board connection structure 10 according to the first preferred embodiment in that the board 30 is replaced with the circuit board 20. The other structure of the circuit board connection structure 10C is the same or substantially the same as in the circuit board connection structure 10, so the same or substantially the same structure will not be described.

The circuit board connection structure 10C is provided by connecting two circuit boards 20 to each other. More specifically, the two circuit boards 20 are connected to each other via the conductive joint material 41 and the conductive joint materials 42 with the connection portion ReJ of one of the circuit boards 20 facing the connection portion ReJ of the other of the circuit boards 20.

As described above, even when the boards to be connected are the thermoplastic multilayer bodies 21, the various advantageous operations and effects of the connection portion ReJ can be obtained by providing the opening holes 292 described above.

The above description assumes an aspect in which the ground conductor 232 is on the main surface 212 of the multilayer body 21. However, as long as the ground conductor 232 is disposed closer to the main surface 212 than the other conductors in the multilayer body 21, the ground conductor 232 may be on a layer on the inner side of the main surface 212. In addition, the ground conductor is illustrated as an example of the planar conductor in the above description. However, in the connection portion ReJ, when the conductor disposed closer to the main surface 212 than the other conductors in the multilayer body 21 is the planar conductor, the structure described above can be applied.

In addition, the structures of the preferred embodiments described above can be combined as appropriate, and the operation and effect corresponding to each of the combinations can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a multilayer body defined by laminated thermoplastic resin layers, the multilayer body including a first main surface on one end in a lamination direction and a second main surface on another end in the lamination direction;
   a mounted conductor on the first main surface; and
   a planar conductor located closer to the second main surface than the mounted conductor and other conductors provided in the multilayer body; wherein
   the multilayer body includes a connection portion joined to an external board via a conductive joint material through use of the mounted conductor, and a circuit portion other than the connection portion;
   a first region includes a first opening hole and a second region includes a second opening hole, the first region being a region of the circuit portion of the planar conductor, the second region being a region of the connection portion of the planar conductor; and
   a ratio of an opening area of the second opening hole to an area of the second region is larger than a ratio of an opening area of the first opening hole to an area of the first region.

2. The circuit board according to claim 1, wherein the multilayer body includes a plurality of the second opening holes, the second opening hole being one of the plurality of second opening holes.

3. The circuit board according to claim 2, wherein the multilayer body includes a plurality of the first opening holes, the first opening hole being one of the first opening holes, and an opening area of a second opening hole having the smallest opening area of the plurality of second opening holes is larger than an opening area of a first opening hole having the largest opening area of the plurality of first opening holes.

4. The circuit board according to claim 3, wherein the plurality of first opening holes are provided periodically.

5. The circuit board according to claim 1, wherein the multilayer body includes a plurality of the first opening holes that are provided periodically, the first opening hole is one of the plurality of first opening holes.

6. The circuit board according to claim 1, wherein the multilayer body includes, therein, an interlayer connection conductor connected to the mounted conductor, the interlayer connection conductor being formed by allowing a conductive paste to solidify.

7. The circuit board according to claim 6, wherein the second opening hole is in a position that is different from a position of the interlayer connection conductor in the lamination direction.

8. The circuit board according to claim 6, wherein the planar conductor includes a slit opening outside a formation region of the interlayer connection conductor in the region of the connection portion in the lamination direction.

9. The circuit board according to claim 1, wherein an insulating protective film is provided on the second main surface of the multilayer body, and the protective film includes a protective film opening in the region of the connection portion of the planar conductor, the protective film opening being open in a central region of the region of the connection portion.

10. The circuit board according to claim 1, wherein the planar conductor connects the connection portion and the circuit portion to each other.

11. The circuit board according to claim 1, wherein the planar conductor is a ground conductor.

12. The circuit board according to claim 11, wherein a signal conductor is provided at an intermediate position in the lamination direction in the multilayer body, and the signal conductor and the ground conductor define a transmission line.

13. The circuit board according to claim 12, wherein a width of the ground conductor is larger than a width of the signal conductor.

14. The circuit board according to claim 12, wherein the ground conductor is wider than the signal conductor.

15. The circuit board according to claim 11, wherein the ground conductor includes opening holes.

16. A circuit board connection structure comprising:
the circuit board according to claim 1; and
the external board; wherein
the circuit board and the external board are connected to each other via the conductive joint material.

17. The circuit board connection structure according to claim 16, wherein a structure of the external board is identical or substantially identical to a structure of the circuit board.

18. A method of manufacturing the circuit board connection structure according to claim 16, the method comprising:
providing the conductive joint material on the external board;
providing the connection portion of the multilayer body on the external board with the first main surface opposing the external board; and
thermally pressure-bonding the circuit board to the external board with a heater bar in contact with the region of the connection portion of the planar conductor.

19. The circuit board according to claim 1, wherein the connection portion includes opening holes.

* * * * *